(12) United States Patent
Takahashi

(10) Patent No.: US 11,863,012 B2
(45) Date of Patent: Jan. 2, 2024

(54) POWER SUPPLY SYSTEM

(71) Applicant: Yazaki Corporation, Tokyo (JP)

(72) Inventor: Atsushi Takahashi, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 122 days.

(21) Appl. No.: 17/705,853

(22) Filed: Mar. 28, 2022

(65) Prior Publication Data

US 2022/0352745 A1 Nov. 3, 2022

(30) Foreign Application Priority Data

Apr. 30, 2021 (JP) ................................. 2021-077460

(51) Int. Cl.
```
H02J 9/06       (2006.01)
B60R 16/03      (2006.01)
G01R 31/40      (2020.01)
```
(52) U.S. Cl.
CPC ............... *H02J 9/06* (2013.01); *B60R 16/03* (2013.01); *G01R 31/40* (2013.01)

(58) Field of Classification Search
CPC .. H02J 9/06; H02J 2310/46; H02J 1/14; H02J 7/1423; H02J 7/34; H02J 1/10; H02J 1/109; H02J 7/36; B60R 16/03; G01R 31/40

See application file for complete search history.

(56) References Cited

U.S. PATENT DOCUMENTS

| | | | |
|---|---|---|---|
| 2018/0222413 A1* | 8/2018 | Aoki | ........................ H02J 7/342 |
| 2019/0123545 A1 | 4/2019 | Maekawa et al. | |
| 2019/0126865 A1 | 5/2019 | Takamatsu et al. | |
| 2090/0126865 | 5/2019 | Takamatsu et al. | |
| 2020/0216002 A1 | 7/2020 | Mazaki et al. | |
| 2020/0233441 A1 | 7/2020 | Morimoto et al. | |

FOREIGN PATENT DOCUMENTS

| | | |
|---|---|---|
| JP | 2017-171157 A | 9/2017 |
| JP | 2019-62727 A | 4/2019 |
| JP | 2019-062727 A | 4/2019 |
| WO | 2017/183512 A1 | 10/2017 |
| WO | 2020/137507 A1 | 7/2020 |

* cited by examiner

*Primary Examiner* — Rexford N Barnie
*Assistant Examiner* — Thai H Tran
(74) *Attorney, Agent, or Firm* — Sughrue Mion, PLLC

(57) ABSTRACT

An objective of the present invention is to provide a power supply system which enables stabilization of power supply voltages of multiple areas and/or redundancy to be achieved with low costs. A power supply system includes a main battery for providing power and a sub-battery which is separate from the main battery and provides power. The power supply system further includes switching boxes in first to fourth areas as a plurality of power supply areas configured to be supplied with power from the main battery and sub-battery, the switching boxes switching on/off states of power supplies into the first to fourth areas from the main battery and from the sub-battery. Furthermore, the power supply system includes a control section for switching control of the on/off states for the switching boxes.

7 Claims, 14 Drawing Sheets

STATE DETECTING METHOD (a)

|  | FAILURE 1 | FAILURE 2 | FAILURE 3 | FAILURE 4 | FAILURE 5 | FAILURE 6 | FAILURE 7 | FAILURE 8 |
|---|---|---|---|---|---|---|---|---|
| SW1 | $i_1 \leq -OC$ OR $v_1 \leq LV$ | $i_2 \leq -OC$ OR $v_2 \leq LV$ | $i_1 \leq -OC$ OR $v_1 \leq LV$ | $i_2 \leq -OC$ OR $v_2 \leq LV$ | $i_1 \leq -OC$ OR $v_1 \leq LV$ | $i_2 \leq -OC$ OR $v_2 \leq LV$ | $i_1 \leq -OC$ OR $v_1 \leq LV$ | $i_2 \leq -OC$ OR $v_2 \leq LV$ |
| SW2 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |
| SW3 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |
| SW4 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |
| DETERMINATION BY CONTROL UNIT | MAIN-SIDE VOLTAGE DROP | SUB-SIDE VOLTAGE DROP | MAIN-SIDE VOLTAGE DROP | SUB-SIDE VOLTAGE DROP | MAIN-SIDE VOLTAGE DROP | SUB-SIDE VOLTAGE DROP | MAIN-SIDE VOLTAGE DROP | SUB-SIDE VOLTAGE DROP |

BATTERY SWITCHING CONTROL (CONTROL OF EACH SW)

(b)

| SWITCHING BOX | FAILURE 1 | FAILURE 2 | FAILURE 3 | FAILURE 4 | FAILURE 5 | FAILURE 6 | FAILURE 7 | FAILURE 8 |
|---|---|---|---|---|---|---|---|---|
| SW1 | ·S1:OFF ·S2:ON | ·S1:ON ·S2:OFF | ·S1:OFF ·S2:ON | ·S1:ON ·S2:OFF | ·S1:OFF ·S2:ON | ·S1:ON ·S2:OFF | ·S1:OFF ·S2:ON | ·S1:ON ·S2:OFF |
| SW2 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |
| SW3 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |
| SW4 | SAME AS ABOVE | SAME AS ABOVE | SAME AS ABOVE | SAME AS ABOVE | SAME AS ABOVE | SAME AS ABOVE | SAME AS ABOVE | SAME AS ABOVE |

FIG.6

| VEHICLE STATE | S1 | S2 | NOTE |
|---|---|---|---|
| VEHICLE IS PARKED | ON | OFF | PREVENTION OF SUB-BATTERY DISCHARGE (PREVENTION OF POWER CONSUMPTION DUE TO DARK CURRENT OF SUB-BATTERY) |
| NORMAL STATE (DRIVING/REGENERATIVE OPERATION) | ON | ON | CHARGING SUB-BATTERY |
| RESTART | OFF | ON | PREVENTION OF VOLTAGE FLUCTUATION |
| MAIN-SIDE VOLTAGE DROP/EARTH FAULT | OFF | ON | BACKUP CONTROL |
| SUB-SIDE VOLTAGE DROP/EARTH FAULT | ON | OFF | BACKUP CONTROL |

FIG.8

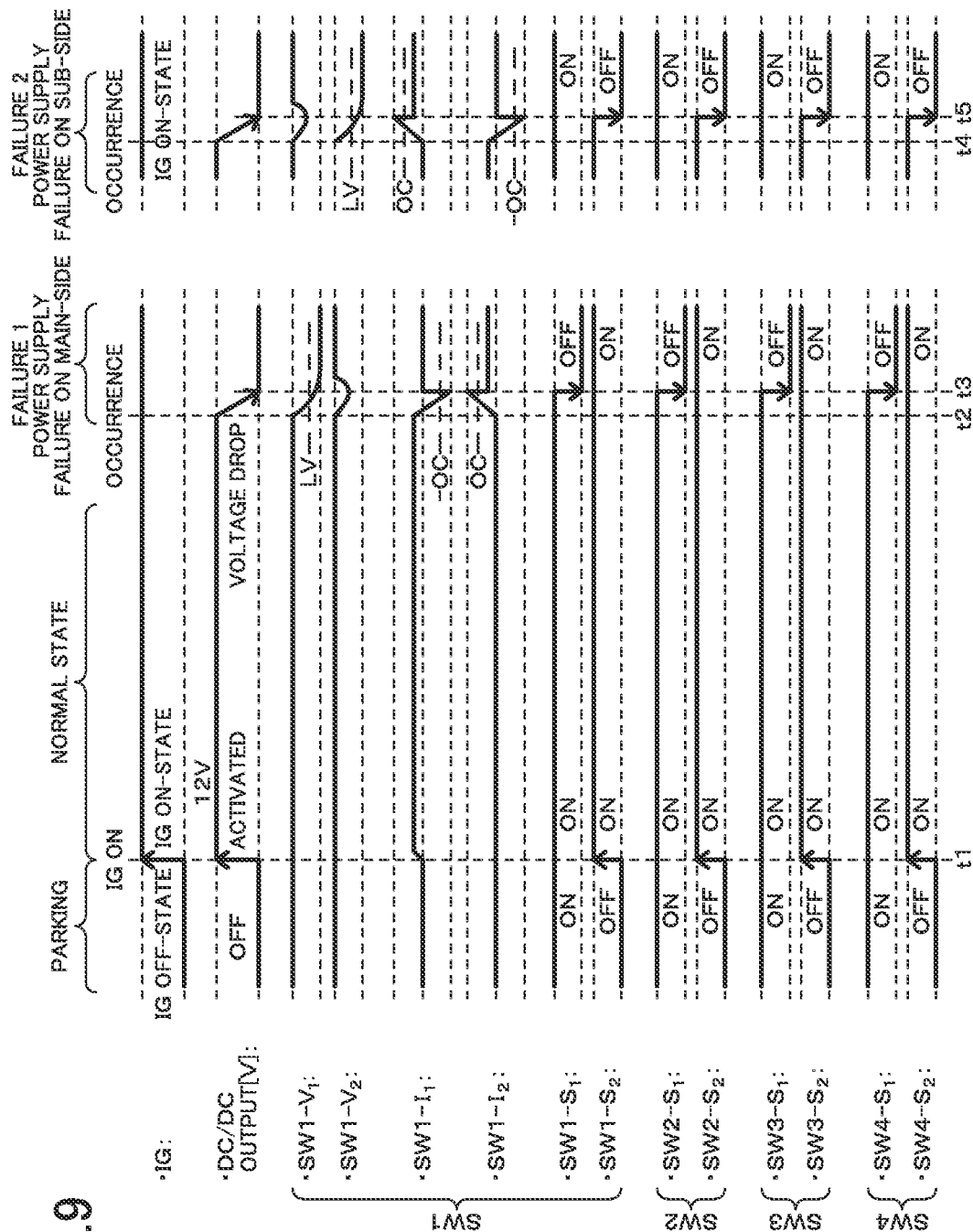

POWER SUPPLY SYSTEM

BACKGROUND OF THE INVENTION

Technical Field

The present invention relates to a power supply system to be provided e.g. in a vehicle.

Background Art

For example, in the case where a 12V power supply system for a vehicle is divided into several areas, it is known to arrange a battery in each of the areas in order to stabilize power supply voltage in each of the areas and/or to achieve redundancy (see e.g. Patent Document 1).

Patent Document 1 describes that a power output section is provided in each of subsystems. Patent Document 1 further describes that one or more inter-subsystem switches and one or more intra-subsystem switches, wherein each inter-subsystem switch is configured to switch connection between adjacent subsystems into a conducting state or a disconnected state and each intra-subsystem switch is provided in each subsystem and configured to switch connection between a power output section and an electrical load into a conducting state or a disconnected state.

CITATION LIST

Patent Literature

Patent Document 1: JP 2019-062727 A

SUMMARY OF THE INVENTION

In the case where a power output section such as a battery is arranged in each of subsystems (areas), as is the case for the invention according to Patent Document 1, a battery is added for each added subsystem. Accordingly, it is necessary to address a problem such as ensuring a space for accommodating the battery, increase in weight and associated decrease in fuel cost efficiency, and increase in costs.

Therefore, the present invention is focused on problems as described above, and an objective of the invention is to provide a power supply system which enables stabilization of power supply voltages of multiple areas and/or redundancy to be achieved with low costs.

In order to achieve this objective, the present invention provides a power supply system including: a first power supply section configured to supply power; a second power supply section configured to supply power, wherein the second power supply section is separate from the first power supply section; switching sections each of which is provided in each of a plurality of power supply areas, the plurality of power supply areas being configured to be supplied with power from the first power supply section and the second power supply section, wherein each of the switching sections is configured to switch an on/off state of power supply from the first power supply section into a corresponding power supply area of the plurality of power supply areas and to switch an on/off state of power supply from the second power supply section into the corresponding power supply area; and a control section configured to perform switching control of the on/off state for the switching sections.

As described above, the present invention enables power supply from the first power supply section and the second power supply section to be switched on and off with the switching sections, whereby it is not necessary to provide a power output section for each area and it is enabled with low costs to stabilize power supply voltages of multiple areas and/or to achieve redundancy.

BRIEF DESCRIPTION OF THE DRAWINGS

FIG. 6 shows tables illustrating a method for detecting various power supply failure states;

FIG. 8 is a table showing on/off states of switches S1 and S2 depending on a state of a vehicle;

FIG. 9 shows an example for a timing diagram illustrating operation of the power supply system;

DETAILED DESCRIPTION OF THE PREFERRED EMBODIMENTS

Figure 1:
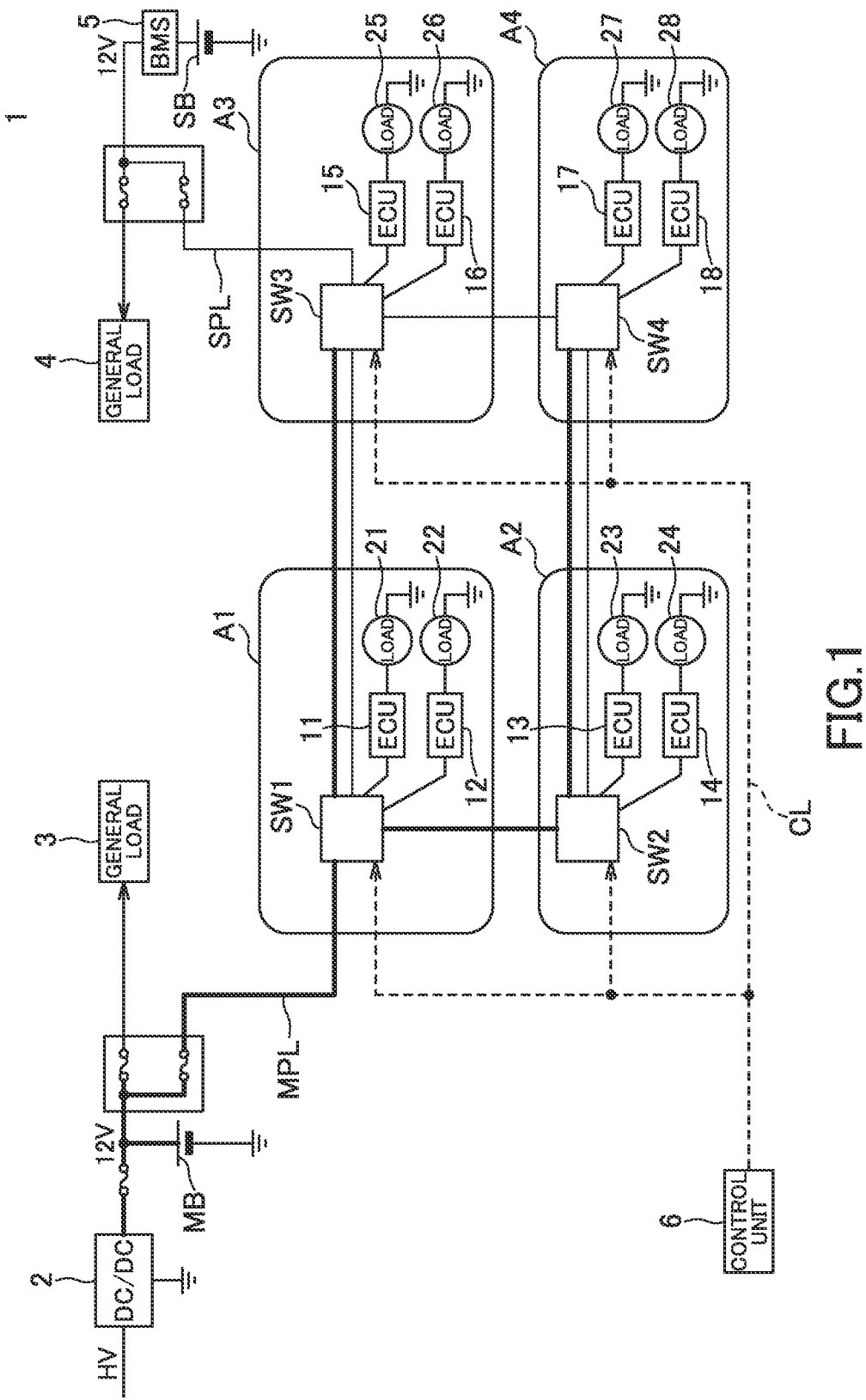
FIG. 1 shows a system structure diagram of a power supply system according to an embodiment of the present invention.

Hereinafter, an embodiment of the present invention will be described with reference to the Drawings. FIG. 1 shows a system structure diagram of a power supply system 1 according to an embodiment of the present invention. A power supply system 1 includes a main battery MB, a sub-battery SB, a first area A1, a second area A2, a third area A3, a fourth area A4, a DC/DC converter 2, general loads 3 and 4, BMS 5, and a control unit 6.

The main battery MB is formed e.g. from a lead-acid battery configured to provide a 12V DC voltage. The main battery MB supplies the general load 3 as well as the first to fourth areas with power via a power supply line MPL. Further, the main battery MB is charged from a power supply system of a high-voltage system (HV) via the DC/DC converter 2. This means that the main battery MB functions as a first power supply section which supplies power.

The sub-battery SB is formed e.g. from a lead-acid battery configured to provide a 12V DC voltage, and/or a lithium-ion or nickel-hydrogen battery which can be connected to the lead-acid battery. The sub-battery SB supplies the general load 4 as well as the first to fourth areas with power via a power supply line SPL. This means that the sub-battery SB functions as a second power supply section which supplies power, wherein the second power supply section separate from the main battery MB (first power supply section).

The first area A1 is one of areas (power supply areas) which are obtained by dividing (sectioning) the power supply system 1. The first area A1 includes a switching box SW1, ECUs 11 and 12, and loads 21 and 22.

Figure 2:
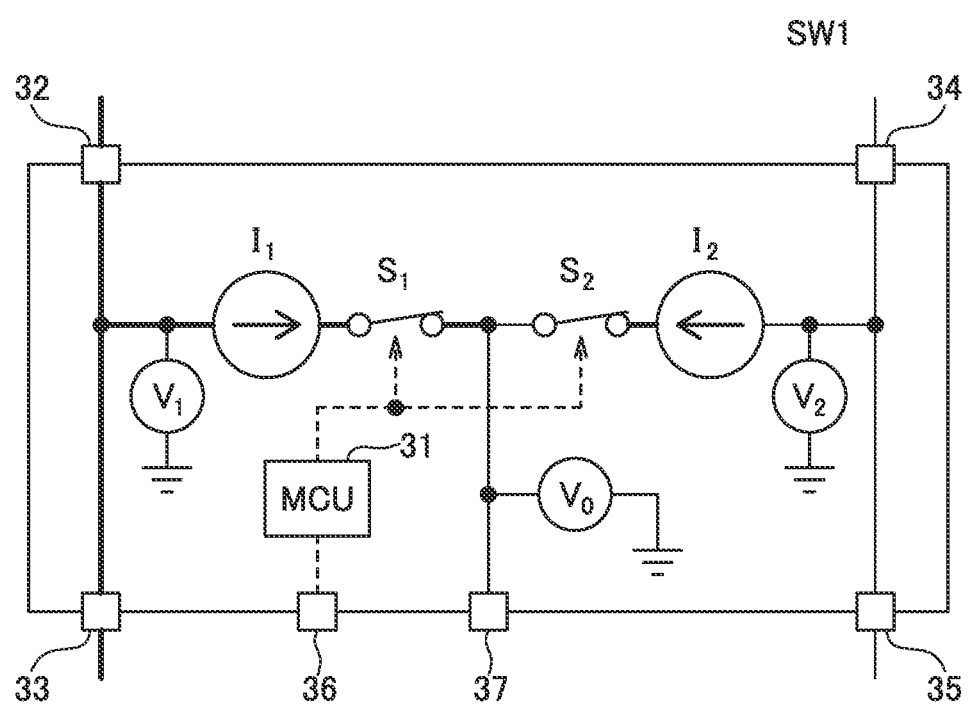
FIG. 2 shows a structure diagram of a switching box according to FIG. 1.

The switching box SW1 switches an on/off state of power supply from the main battery MB and an on/off state of power supply from the sub-battery SB. A configuration of the switching box SW1 is shown in FIG. 2. Namely, the switching box SW1 functions as one of switching sections each of which is provided in each of a plurality of power supply areas, the plurality of power supply areas being configured to be supplied with power from the main battery MB (first power supply section) and the sub-battery SB (second power supply section), wherein each of the switching sections is configured to switch an on/off state of power supply from the main battery MB (first power supply section) into a corresponding power supply area of the plurality of power supply areas and to switch an on/off state of power supply from the sub-battery SB (second power supply section) into the corresponding power supply area. The wording "corresponding power supply area" refers to an area itself in which the switching box is arranged, wherein for the switching box SW1, the "corresponding power supply area" is the first area, for example.

The switching box SW1 includes a main-side current meter I1, a sub-side current meter I2, a load voltage meter V0, a main-side voltage meter V1, a sub-side voltage meter V2, switches S1 and S2, an MCU 31, main-side connection terminals 32 and 33, sub-side connection terminals 34 and 35, a control line connection terminal 36, and a load connection terminal 37.

The main-side current meter I1 is arranged between the main-side connection terminals 32 and 33 and the switch S1. The main-side current meter I1 monitors (detects) a value of current which flows to the switch S1 from the power supply line MPL connected to the main-side connection terminal 32 or main-side connection terminal 33. This means that the main-side current meter I1 functions as a first current detecting section which detects a first current value which is a value of a current flowing from a side of the main battery MB (first power supply section) in the switching boxes SW1 to SW4 (switching sections).

The sub-side current meter I2 is arranged between the sub-side connection terminals 34 and 35 and the switch S2. The sub-side current meter I2 monitors (detects) a value of current which flows to the switch S2 from the power supply line SPL connected to the sub-side connection terminal 34 or sub-side connection terminal 35. This means that the sub-side current meter I2 functions as a second current detecting section which detects a second current value which is a value of a current flowing from a side of the sub-battery SB (second power supply section) in the switching boxes SW1 to SW4 (switching sections). It is to be noted that it is sufficient to configure the main-side current meter I1 and/or the sub-side current meter I2 from well-known current sensors, such as resistive and/or magnetic current sensors.

The load voltage meter V0 is arranged between a node between the switch S1 and the switch S2 and the load connection terminal 37. The load voltage meter V0 monitors (detects) a value of voltage which is applied to the load (ECU 11, 12, loads 21, 22).

The main-side voltage meter V1 is arranged between the main-side connection terminals 32 and 33 and the main-side current meter I1. The main-side voltage meter V1 monitors (detects) a value of voltage which is applied to the switch S1. This means that the main-side voltage meter V1 functions as a first voltage detecting section configured to detect a first voltage value which is a value of a voltage on the side of the main battery MB (first power supply section) in the switching boxes SW1 to SW4 (switching sections).

The sub-side voltage meter V2 is arranged between the sub-side connection terminals 34 and 35 and the sub-side current meter I2. The sub-side voltage meter V2 monitors (detects) a value of voltage which is applied to the switch S2. This means that the sub-side voltage meter V2 functions as a second voltage detecting section configured to detect a second voltage value which is a value of a voltage on the side of the sub-battery SB (second power supply section) in the switching boxes SW1 to SW4 (switching sections). It is to be noted that it is sufficient to configure the main-side voltage meter V1 and the sub-side voltage meter V2 e.g. from a well-known voltage detection circuit, such as a resistor, which is arranged between an associated wiring and a ground.

The switch S1 is arranged between the main-side current meter I1 and the switch S2 and configured as a switch which switches a conducting state to the loads and the switch S2. The switch S1 is configured with a mechanical relay or a semiconductor switch, such as a MOSFET (Metal Oxide Semiconductor Field Effect Transistor). This means that the switch S1 functions as a first switch which is configured to switch the on/off state of the power supply from the main battery MB (first power supply section).

The switch S2 is arranged between the sub-side current meter I2 and the switch S1 and configured as a switch which switches a conducting state to the loads and the switch S1. Similarly to the switch S1, the switch S2 is configured with a mechanical relay or a semiconductor switch, such as a MOSFET. This means that the switch S2 functions as a second switch which is configured to switch the on/off state of the power supply from the sub-battery MB (second power supply section).

Further, the switch S1 (first switch) and switch S2 (second switch) are such that power supply to load is initiated by switching on one of the switches, wherein the load is provided in the power supply area, as evident from FIGS. 1 and 2.

The MCU 31 is a microcontroller unit including a control circuit such as a CPU (Central Processing Unit), wherein the MCU 31 performs switching control of the on/off state of the switch S1 and switch S2 based on a control signal which is outputted by the control unit 6 via a control line CL. Furthermore, the MCU 31 provides detected values of the current meters I1 and I2 and voltage meters V0, V1 and V2 to the control unit 6 via the control line CL.

The main-side connection terminals 32 and 33 are configured as connection terminals for connecting the power supply line MPL thereto. The main battery MB is electrically connected to the main-side connection terminals 32 and 33 directly or via another switching box. For example, in the case of FIG. 1, the main battery MB is connected directly to the main-side connection terminal 32 of the switching box SW1, wherein a switching box SW2 and a switching box SW2 as other switching boxes are connected to the main-side connection terminal 33 of the switching box SW1.

The sub-side connection terminals 34 and 35 are configured as connection terminals for connecting the power supply line SPL thereto. The sub-battery SB is electrically connected to the sub-side connection terminals 34 and 35 directly or via another switching box. For example, in the case of FIG. 1, the sub-battery SB is connected directly to the sub-side connection terminal 34 of the switching box SW3, wherein the switching box SW1 and a switching box SW4 as other switching boxes are connected to the sub-side connection terminal 35 of the switching box SW3.

The control line connection terminal 36 is configured for connecting the control line CL thereto, wherein the control line CL serves for inputting/outputting e.g. signals of the control unit 6 and the MCU 31. The load connection terminal 37 is configured for connecting the loads (ECU 11, 12) thereto.

Returning to the description of FIG. 1, the ECU 11 is configured as a well-known electronic control unit installed in a vehicle such as an automobile, wherein the ECU 11 controls the load 21. The ECU 12 is configured as a well-known electronic control unit installed in the vehicle such as an automobile, wherein the ECU 12 controls the load 22.

Basically, the second to fourth areas A2 to A4 are configured in the same manner as the first area A1. The switching boxes SW2 to SW4 which are arranged in the respective areas are also configured in the same manner as the switching box SW1 as shown in FIG. 2. Of course, the switching boxes SW2 to SW4 function as switching sections similarly.

As shown in FIG. 1, the power supply line MPL from the main battery MB is connected to the switching box SW2 and switching box SW3 via the switching box SW1 and connected to the switching box SW4 via the switching box SW2. Furthermore, the power supply line SPL from the sub-battery SB is connected to the switching box SW1 and switching box SW4 via the switching box SW3 and connected to the switching box SW2 via the switching box SW4.

The DC/DC converter 2 has a voltage reducing function which reduces a DC voltage received from the high-voltage system and provides it to the main battery MB. Further, the DC/DC converter 2 may have a voltage increasing function which increases the DC voltage received from the main battery MB and provides it to the high-voltage system.

The general load 3 is a load which is operated with power supplied by the main battery MB. The general load 4 is a load which is operated with power supplied by the sub-battery SB. Unlike loads 21 to 28, the general loads 3 and 4 indicate loads which do not need redundancy.

The BMS 5 is a battery management system and configured as a well-known system (circuit) which monitors and controls a state of a cell(s) of the sub-battery SB.

The control unit 6 controls the switching boxes SW1 to SW4 arranged in the first to fourth areas A1 to A4. The control unit 6 is configured with a microcontroller for example, which includes e.g. a CPU. This means that the control unit 6 functions as a control section which performs switching control of the on/off state of the power supply into the power supply areas from the main battery MB (first power supply section) and the on/off state of the power supply into the power supply areas from the sub-battery SB (second power supply section) for the switching boxes SW1 to SW4 (switching sections).

Figure 3:
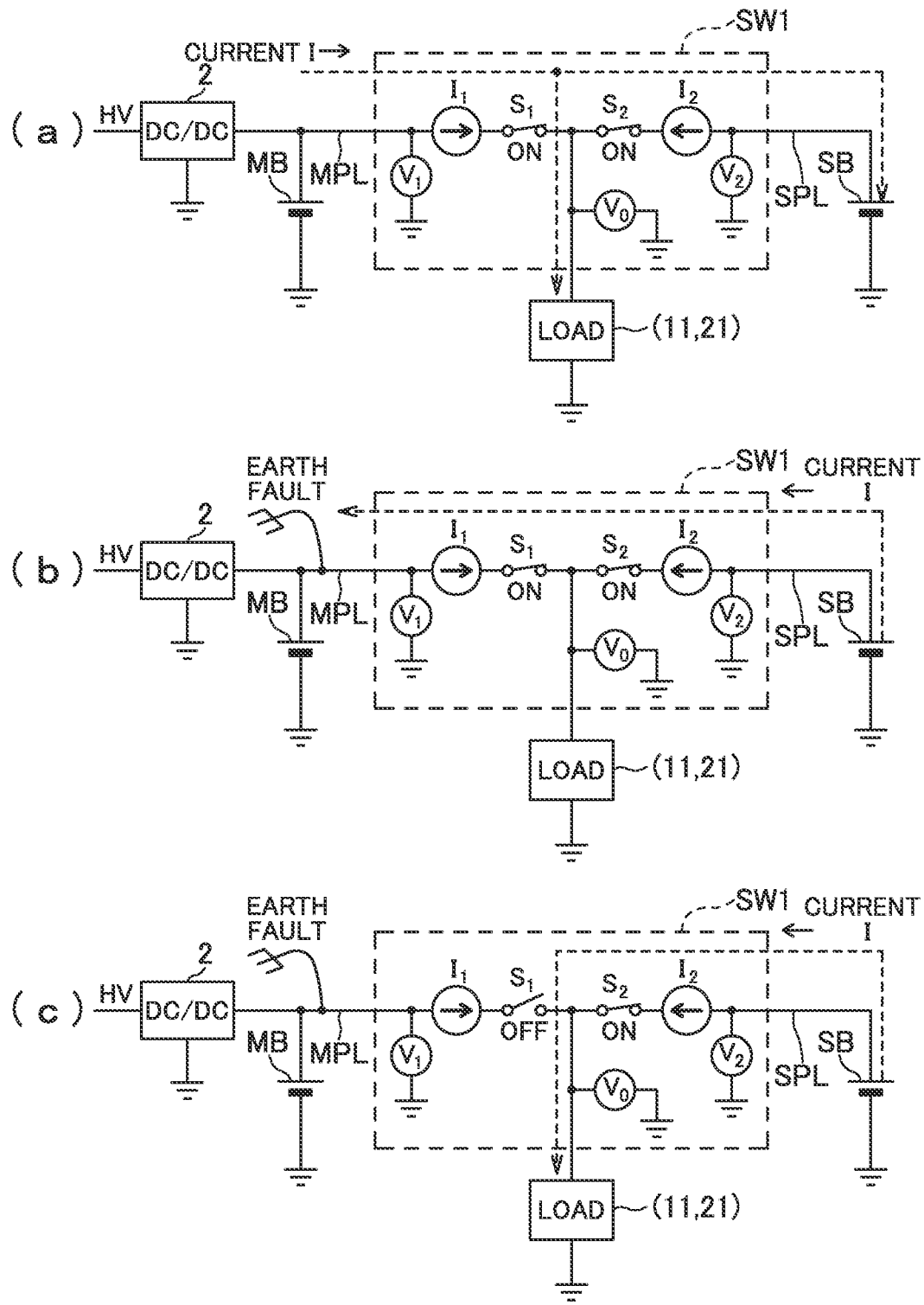
FIG. 3 shows views for explanation of principal operation of the power supply system according to FIG. 1.

Next, a principal operation of the above-described power supply system 1 will be described with reference to FIG. 3. FIG. 3 shows views for explaining operation of the main battery MB, sub-battery SB and switching box SW1 in the case of a normal state and a state in which an earth fault exists. For better understanding, FIG. 3 shows only the main battery MB, sub-battery SB, switching box SW1, DC/DC converter 2 and a LOAD. The LOAD is an ECU 11, a load 21 and/or other, for example. Although the following description in FIG. 3 will be made with reference to the switching box SW1, the switching boxes SW2 to SW4 are operated in the same manner.

FIG. 3 shows a normal state in (a). As used herein, the term "normal state" refers to a state in which all current and voltage values fulfill the following formulae (1) to (4), wherein the switch S1 and switch S2 are switched on in this state. In the formulae (1) to (4), i1 indicates a current value (first current value) detected at the main-side current meter I1, i2 indicates a current value (second current value) detected at the sub-side current meter I2, v1 indicates a voltage value (first voltage value) detected at the main-side voltage meter V1, v2 indicates a voltage value (second voltage value) detected at the sub-side voltage meter V2, and v0 indicates a voltage value detected at the load voltage meter V0. Furthermore, OC indicates an overcurrent detecting level, LV indicates a voltage drop detecting level, wherein the overcurrent and voltage drop detecting level have predetermined values respectively.

$$-OC \leq i1 < OC \qquad (1)$$

$$-OC \leq i2 < OC \qquad (2)$$

$$v1 \geq v2 > LV \qquad (3)$$

$$v0 > LV \qquad (4)$$

The power supply system 1 as shown in FIG. 1 is provided such that in the normal state, a power supply path from the main battery MB and a power supply path from the sub-battery SB are electrically connected to each other by switching on both of the switch S1 and the switch S2, so that the load (LOAD) is supplied with power from the main battery MB and the sub-battery SB is charged from the main battery MB. Accordingly, current I flows from the main battery MB toward the load and sub-battery (FIG. 3(a)).

Here, assuming that an earth fault occurs on the power supply line MPL between the main battery MB and the switching box SW1 (FIG. 3(b)), the current value i1 detected at the main-side current meter I1 in such a state indicates an overcurrent in a direction opposite to that in the normal state (−OC>i1), and/or the voltage value v1 detected at the main-side voltage meter V1 indicates a voltage drop to a level equal to or below the voltage drop detecting level (v1≤LV). In this case, it is determined that a power supply failure exists, wherein the switch S1 is switched off in order to stabilize power supply to the load (FIG. 3(c)). Once the switch S1 is switched off, current flow is blocked from the sub-battery SB to a side of the main battery MB so that the current I flows toward the load.

Figure 4:
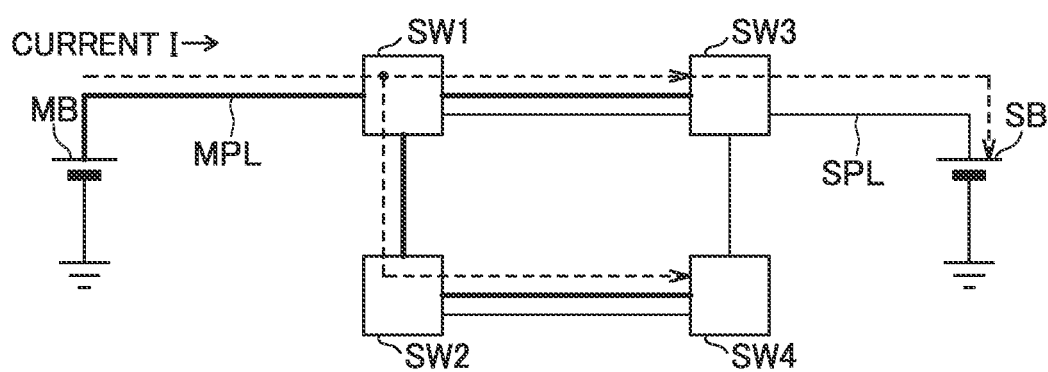
FIG. 4 shows a schematic view of the power supply system in a normal state.
Figure 5:
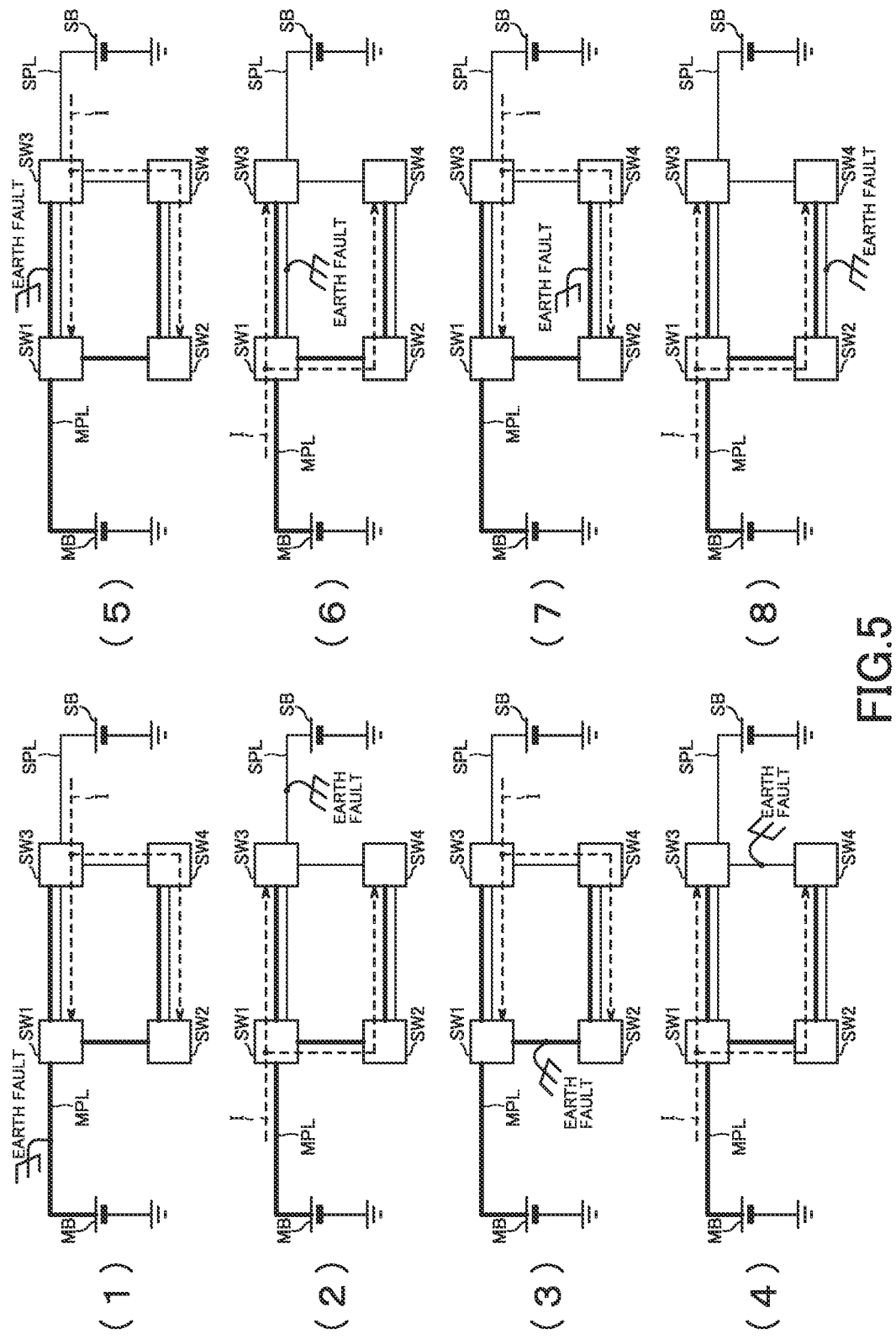
FIG. 5 shows schematic views of the power supply system with power supply failure.

Next, an example for the power supply failure in the power supply system 1 as shown in FIG. 1 will be described with reference to FIGS. 4 and 5. FIG. 4 shows a schematic view of the power supply system 1 in the normal state (without power supply failure). For better understanding, FIGS. 4 and 5 show more simplified views of the power supply system 1 than FIG. 1. Since the normal state exists in FIG. 4, the current I flows from the main battery MB to the sub-battery SB as described above. In this case, the current I also flows from the switching box SW1 to the switching box SW4.

FIG. 5 shows schematic views of the power supply system 1 with power supply failure. These views of FIG. 5 show eight patterns. The first view shows a case where an earth fault exists on the power supply line MPL between the main battery MB and the switching box SW1 (FIG. 5(1)). The second view shows a case where an earth fault exists on the power supply line SPL between the sub-battery SB and the switching box SW3 (FIG. 5(2)). The third view shows a case where an earth fault exists on the power supply line MPL between the switching box SW1 and the switching box SW2 (FIG. 5(3)). The fourth view shows a case where an earth fault exists on the power supply line SPL between the switching box SW3 and the switching box SW4 (FIG. 5(4)).

The fifth view shows a case where an earth fault exists on the power supply line MPL between the switching box SW1 and the switching box SW3 (FIG. 5(5)). The sixth view shows a case where an earth fault exists on the power supply line SPL between the switching box SW1 and the switching box SW3 (FIG. 5(6)). The seventh view shows a case where an earth fault exists on the power supply line MPL between the switching box SW2 and the switching box SW4 (FIG. 5(7)). The eighth view shows a case where an earth fault exists on the power supply line SPL between the switching box SW2 and the switching box SW4 (FIG. 5(8)).

A method for detecting the power supply failure states as shown in FIG. 5 is illustrated in tables of FIG. 6. In FIG. 6, (a) shows detected states at the respective boxes and corresponding determinations by the control unit 6 for the various power supply failure states according to (1) to (8) in FIG. 5. In FIG. 6, (b) shows control of switching on/off the switches S1 and S2 in each of the switching boxes for each of the detected power supply failure states.

First, in the case of (1) in FIG. 5, an earth fault exists on the power supply line MPL between the main battery MB and the switching box SW1 so that $i1 \leq -OC$ for the current value i1 detected at the main-side current meter I1, or $v1 \leq LV$ for the voltage value v1 detected at the main-side voltage meter V1 in the switching box SW1. This is also the case for the switching boxes SW2 to SW4. This exhibits a power supply failure state as described in FIG. 3 so that it is determined in the control unit 6 that the main-side voltage has dropped (FIG. 6(a), Failure 1).

After Failure 1 according to (a) in FIG. 6 has been determined, the control unit 6 switches off the switches S1 in the switching boxes SW1 to SW4. The switches S2 remains in an on-state (FIG. 6(b), Failure 1). In this manner, the current I flows into the switching boxes SW1 to SW4 from the sub-battery SB as shown in (1) of FIG. 5 so that power supply to the load can be stabilized.

In the case of (2) in FIG. 5, an earth fault exists on the power supply line SPL between the sub-battery SB and the switching box SW3 so that $i2 \leq -OC$ for the current value i2 detected at the sub-side current meter I2, or $v2 \leq LV$ for the voltage value v2 detected at the sub-side voltage meter V2 in the switching box SW1. This is also the case for the switching boxes SW2 to SW4. This exhibits the power supply failure state as described in FIG. 3 so that it is determined in the control unit 6 that the sub-side voltage has dropped (FIG. 6(a), Failure 2).

After Failure 2 according to (a) in FIG. 6 has been determined, the control unit 6 switches off the switches S2 in the switching boxes SW1 to SW4. The switches S1 remains in an on-state (FIG. 6(b), Failure 2). In this manner, the current I flows into the switching boxes SW1 to SW4 from the main battery MB as shown in (2) of FIG. 5 so that power supply to the load can be stabilized.

In the case of (3) in FIG. 5, an earth fault exists on the power supply line MPL between the switching box SW1 and the switching box SW2 so that in the switching box SW1, $i1 \leq -OC$ for the current value i1 or $v1 \leq LV$ for the voltage value v1. This is also the case for the switching boxes SW2 to SW4. This exhibits the power supply failure state as described in FIG. 3 so that it is determined in the control unit 6 that the main-side voltage has dropped (FIG. 6(a), Failure 3).

After Failure 3 according to (a) in FIG. 6 has been determined, the control unit 6 switches off the switches S1 in the switching boxes SW1 to SW4. The switches S2 remains in an on-state (FIG. 6(b), Failure 3). In this manner, the current I flows into the switching boxes SW1 to SW4 from the sub-battery SB as shown in (3) of FIG. 5 so that power supply to the load can be stabilized.

In the case of (4) in FIG. 5, an earth fault exists on the power supply line SPL between the switching box SW3 and the switching box SW4 so that in the switching box SW1, $i2 \leq -OC$ for the current value i2 or $v2 \leq LV$ for the voltage value v2. This is also the case for the switching boxes SW2 to SW4. This exhibits the power supply failure state as described in FIG. 3 so that it is determined in the control unit 6 that the sub-side voltage has dropped (FIG. 6(a), Failure 4).

After Failure 4 according to (a) in FIG. 6 has been determined, the control unit 6 switches off the switches S2 in the switching boxes SW1 to SW4. The switches S1 remains in an on-state (FIG. 6(b), Failure 4). In this manner, the current I flows into the switching boxes SW1 to SW4 from the main battery MB as shown in (4) of FIG. 5 so that power supply to the load can be stabilized.

In the case of (5) in FIG. 5, an earth fault exists on the power supply line MPL between the switching box SW1 and the switching box SW3 so that in the switching box SW1, $i1 \leq -OC$ for the current value i1 or $v1 \leq LV$ for the voltage value v1. This is also the case for the switching boxes SW2 to SW4. This exhibits the power supply failure state as described in FIG. 3 so that it is determined in the control unit 6 that the main-side voltage has dropped (FIG. 6(a), Failure 5).

After Failure 5 according to (a) in FIG. 6 has been determined, the control unit 6 switches off the switches S1 in the switching boxes SW1 to SW4. The switches S2 remains in an on-state (FIG. 6(b), Failure 5). In this manner, the current I flows into the switching boxes SW1 to SW4 from the sub-battery SB as shown in (5) of FIG. 5 so that power supply to the load can be stabilized.

In the case of (6) in FIG. 5, an earth fault exists on the power supply line SPL between the switching box SW1 and the switching box SW3 so that in the switching box SW1, $i2 \leq -OC$ for the current value i2 or $v2 \leq LV$ for the voltage value v2. This is also the case for the switching boxes SW2 to SW4. This exhibits the power supply failure state as described in FIG. 3 so that it is determined in the control unit 6 that the sub-side voltage has dropped (FIG. 6(a), Failure 6).

After Failure 6 according to (a) in FIG. 6 has been determined, the control unit 6 switches off the switches S2 in the switching boxes SW1 to SW4. The switches S1 remains in an on-state (FIG. 6(b), Failure 6). In this manner, the current I flows into the switching boxes SW1 to SW4 from the main battery MB as shown in (6) of FIG. 5 so that power supply to the load can be stabilized.

In the case of (7) in FIG. 5, an earth fault exists on the power supply line MPL between the switching box SW2 and the switching box SW4 so that in the switching box SW1, $i1 \leq -OC$ for the current value i1 or $v1 \leq LV$ for the voltage value v1. This is also the case for the switching boxes SW2 to SW4. This exhibits the power supply failure state as described in FIG. 3 so that it is determined in the control unit 6 that the main-side voltage has dropped (FIG. 6(a), Failure 7).

After Failure 7 according to (a) in FIG. 6 has been determined, the control unit 6 switches off the switches S1 in the switching boxes SW1 to SW4. The switches S2 remains in an on-state (FIG. 6(b), Failure 7). In this manner, the current I flows into the switching boxes SW1 to SW4 from the sub-battery SB as shown in (7) of FIG. 5 so that power supply to the load can be stabilized.

In the case of (8) in FIG. 5, an earth fault exists on the power supply line SPL between the switching box SW2 and the switching box SW4 so that in the switching box SW1, i2≤−OC for the current value i2 or v2≤LV for the voltage value v2. This is also the case for the switching boxes SW2 to SW4. This exhibits the power supply failure state as described in FIG. 3 so that it is determined in the control unit 6 that the sub-side voltage has dropped (FIG. 6(a), Failure 8).

After Failure 8 according to (a) in FIG. 6 has been determined, the control unit 6 switches off the switches S2 in the switching boxes SW1 to SW4. The switches S1 remains in an on-state (FIG. 6(b), Failure 8). In this manner, the current I flows into the switching boxes SW1 to SW4 from the main battery MB as shown in (8) of FIG. 5 so that power supply to the load can be stabilized.

For the failures as described above, if a drop in the main-side voltage or in the sub-side voltage were detected when I1<0 A and/or I2<0 A, a misdetection might occur in the case of a potential temporary power supply to a main-side load and/or in the case of charging the sub-battery SB. Therefore, by comparison with the overcurrent detecting level OC (−OC), it is ensured that power supply failures can be determined.

Figure 7:
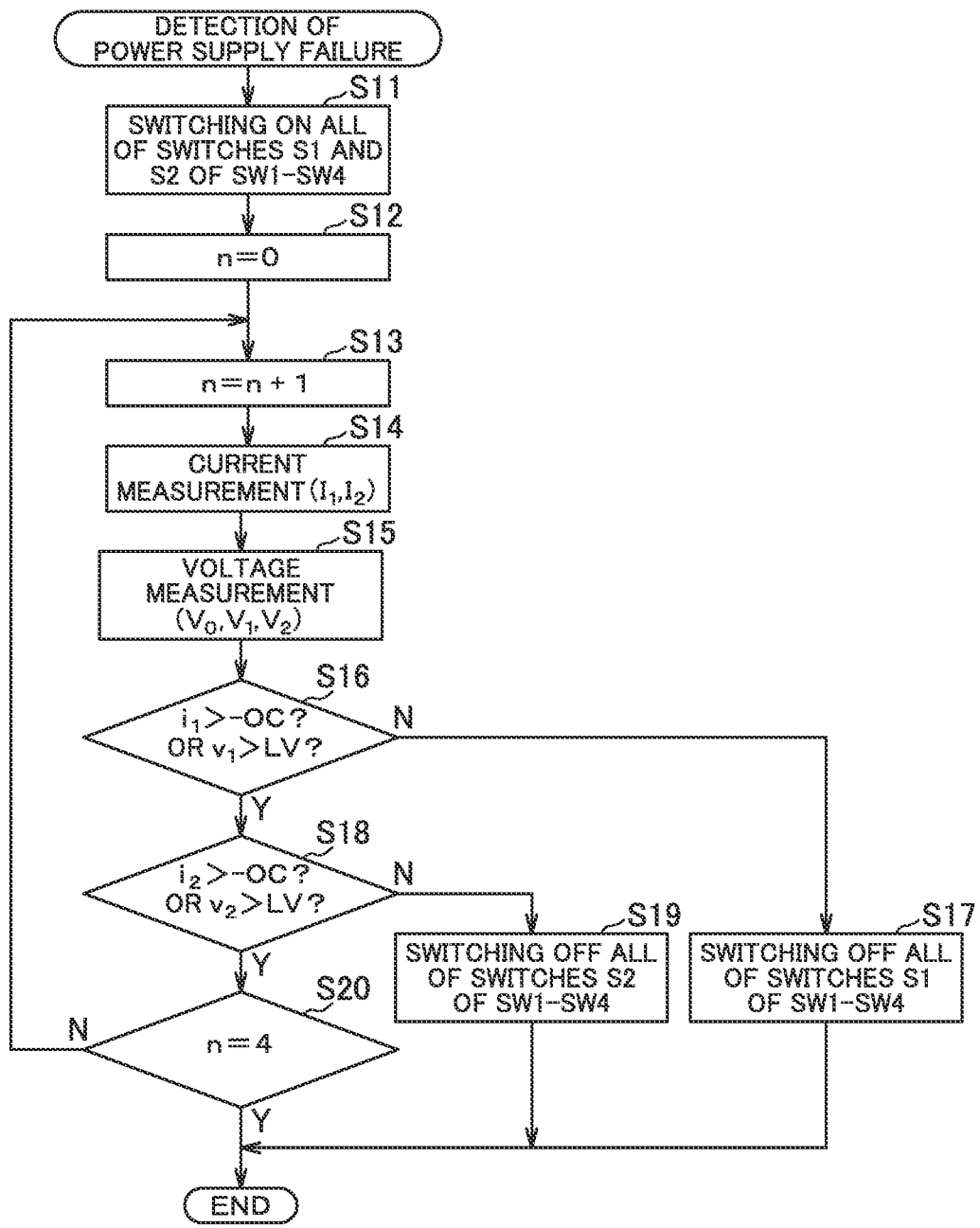
FIG. 7 is a flowchart of operation in a control unit 6 according to FIG. 1.

Next, operation in the control unit 6 as described above will be described with reference to a flowchart in FIG. 7. First, the switches S1 and switches S2 of the switching boxes SW1 to SW4 are all switched on (step S11).

Next, a variable n is set to "0" (step S12). A value of this variable n may be held e.g. in a memory inside the control unit 6. Then, "1" is added to the variable n (step S13). The above-mentioned memory or the like is overwritten with the added value. This variable n corresponds to number parts of the reference signs SW1 to SW4, wherein the following steps are instructions and determination for one switching box, except for steps S17, S19 and S20.

Next, the current values in the switching box are measured (step S14). Specifically, a control signal or the like is provided to the control line CL to cause the MCU 31 in the switching box (SW1 when n=1) to measure the current values i1 and i2 and to transmit measurement results (detection results).

Next, the voltage values in the switching box are measured (step S15). Specifically, a control signal or the like is provided to the control line CL to cause the MCU 31 in the switching box (SW1 when n=1) to measure the voltage values v0, v1 and v2 and to transmit measurement results (detection results). The voltage value v0 refers to a voltage value detected at the load voltage meter V0. It is to be noted that the steps S14 and S15 may be interchanged in the sequence.

Next, for the current values and voltage values measured in steps S14 and S15, it is determined whether or not the condition is fulfilled that the current value i1>−OC or the voltage value v1>LV (step S16). If the determination in step S16 shows that the condition is not fulfilled (step S16; N), the power supply failure state as described in FIG. 3 exists. Thus, it is determined as a main-side power supply failure, and the switches S1 of the switching boxes SW1 to SW4 are all switched off (step S17).

If the determination in step S16 shows that the condition is fulfilled (step S16; Y), it is determined whether or not the condition is fulfilled that the current value i2>−OC or the voltage value v2>LV (step S18). If the determination in step S18 shows that the condition is not fulfilled (step S18; N), the power supply failure state as described in FIG. 3 exists. Thus, it is determined as a sub-side power supply failure, and the switches S2 of the switching boxes SW1 to SW4 are all switched off (step S19).

If the determination in step S18 shows that the condition is fulfilled (step S18; Y), it is determined that there is no abnormality (normal state), and it is determined whether the variable n is "4" or not (step S20). If the variable n is not "4" (step S20; N), the process returns to step S13, wherein "1" is added to the variable n, and the measurement and determination are performed for a next switching box. On the other hand, if the variable n is "4" (step S20; Y), the flowchart is ended.

As described above, the control unit 6 (control section) controls the switching boxes SW1 to SW4 (switching sections) based on the current value i1 (first current value), voltage value v1 (first voltage value), current value i2 (second current value) and voltage value v2 (second voltage value).

Further, the control unit 6 (control section) detects a power supply failure based on the current value i1, voltage value v1, current value i2 and voltage value v2. Then, if a power supply failure exists on the side of the main battery MB (first power supply section), power supply from the side of the main battery MB (first power supply section) is switched off, while if a power supply failure exists on the side of the sub-battery SB (second power supply section), power supply from the side of the sub-battery SB (second power supply section) is switched off.

Although in the above description, both of the current and voltage values are used for detection of power supply failure, it is to be noted that the detection of power supply failure may be performed by using only the current values, or by using only the voltage values. For example, referring to the flowchart of FIG. 7, only either step S14 or step S15 may be performed, wherein in steps S16 and S17, only either the current values or the voltage values may be used for the determination. The same applied to FIG. 6.

FIG. 8 shows a table showing on/off states of switches S1 and S2 depending on a state of a vehicle. First, when the vehicle is parked, the switch S1 is switched on and the switch S2 is switched off. This is aimed at preventing discharge of the sub-battery SB, i.e., power consumption of the sub-battery SB due to dark current. The detection of parking may be accomplished via a well-known method, such as detection of ignition-off.

In the normal state, such as driving or regenerative operation, both of the switches S1 and S2 are switched on. In this state, the sub-battery SB is charged in addition to power supply to the load, as described above. In the case of restart, the switch S1 is switched off, while the switch S2 is switched on. This means that when restarting an engine e.g. in a hybrid vehicle, the switch S1 is temporarily switched off and power supply is thus performed from the sub-battery SB, which prevents voltage fluctuation in each of the areas and always enables stable power supply.

In the case of the main-side voltage drop or earth fault, the switch S1 is switched off and the switch S2 is switched on as a backup control, as described above. In the case of sub-side voltage drop or earth fault, the switch S1 is switched on and the switch S2 is switched off as a backup control, as described above.

FIG. 9 shows an example for a timing diagram illustrating operation of the above-described power supply system 1. This Figure shows the cases of (1) in FIG. 5/Failure 1 in FIG.

6 and (2) in FIG. 5/Failure 2 in FIG. 6. It is to be noted that operation for (3), (5) and (7) in FIG. 5/Failures 3, 5 and 7 is configured in a similar manner as operation for (1) in FIG. 5/Failure 1 in FIG. 6, wherein operation for (4), (6) and (8) in FIG. 5/Failures 4, 6 and 8 in FIG. 6 is configured in a similar manner as operation for (2) in FIG. 5/Failure 2 in FIG. 6.

In FIG. 9, IG indicates ignition, DC/DC OUTPUT indicates output of the DC/DC converter 2, SW1-V1 indicates the voltage value v1 of the voltage meter V1 in the switching box SW1, SW1-V2 indicates the voltage value v2 of the voltage meter V2 in the switching box SW1, SW1-I1 indicates the current value i1 of the current meter I1 in the switching box SW1, SW1-I2 indicates the current value i2 of the current meter I2 in the switching box SW1, SW1-S1 indicates the switch S1 in the switching box SW1, and SW1-S2 indicates the switch S2 in the switching box SW1. SW2-S1 indicates the switch S1 in the switching box SW2, SW2-S2 indicates the switch S2 in the switching box SW2, SW3-S1 indicates the switch S1 in the switching box SW3, SW3-S2 indicates the switch S2 in the switching box SW3, SW4-S1 indicates the switch S1 in the switching box SW4, and SW4-S2 indicates the switch S2 in the switching box SW4.

In FIG. 9, an initial state exists first in which the switch S1 is switched on and the switch S2 is switched off (see parking in FIG. 8). Then, if the ignition turns on (IG ON) at time t1, the control unit 6 switches the switch S2 on (see the normal state in FIG. 8).

Then, if a power supply failure occurs on the main-side at time t2, the DC/DC converter 2 starts to reduce a voltage of its output. This is accompanied by SW1-V1 and SW1-V2 starting to reduce their voltage values, wherein SW1-I1 also starts to reduce its current value. On the other hand, SW1-I2 starts to increase its current value.

Then, SW1-V1 is reduced to the voltage drop detecting level LV or smaller at time t3, and SW1-I1 is reduced to —OC or smaller (SW1-I2 is equal to or larger than OC). Therefore, the power supply failure state as described in FIG. 3 exists so that the control unit 6 switches the switch S1 off. The switch S2 remains in an on-state.

If a power supply failure occurs on the sub-side at time t4 (after time t1), the DC/DC converter 2 starts to reduce a voltage of its output. This is accompanied by SW1-V1 and SW1-V2 starting to reduce their voltage values, wherein SW1-I2 also starts to reduce its current value. On the other hand, SW1-I1 starts to increase its current value.

Then, SW1-V2 is reduced to the voltage drop detecting level LV or smaller at time t5, and SW1-I2 is reduced to —OC or smaller (SW1-I1 is equal to or larger than OC). Therefore, the power supply failure state as described in FIG. 3 exists so that the control unit 6 switches the switch S2 off. The switch S1 remains in an on-state.

Figure 10:
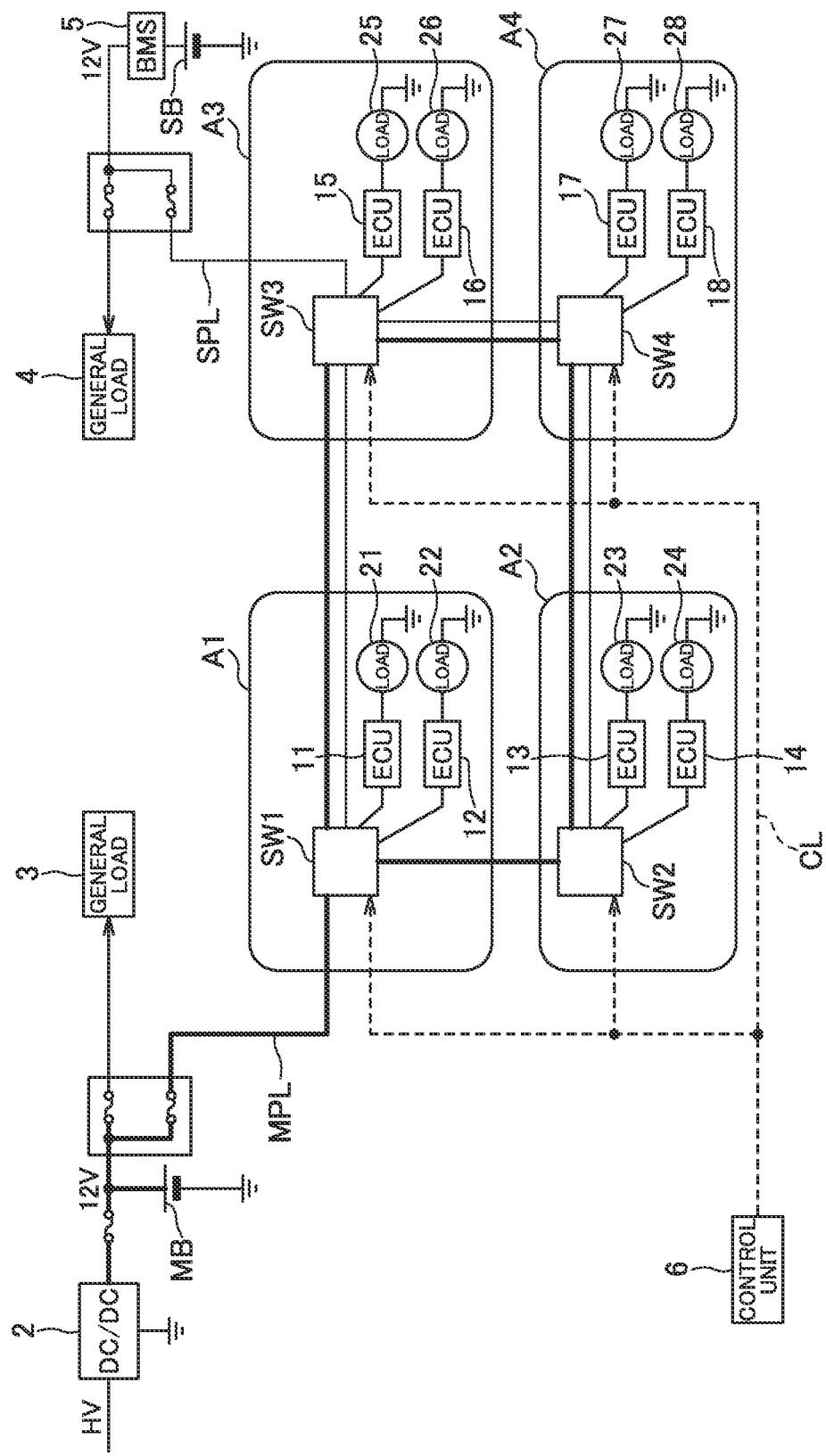
FIG. 10 shows another example for wiring arrangement of a power supply line MPL and a power supply line SPL.
Figure 11:
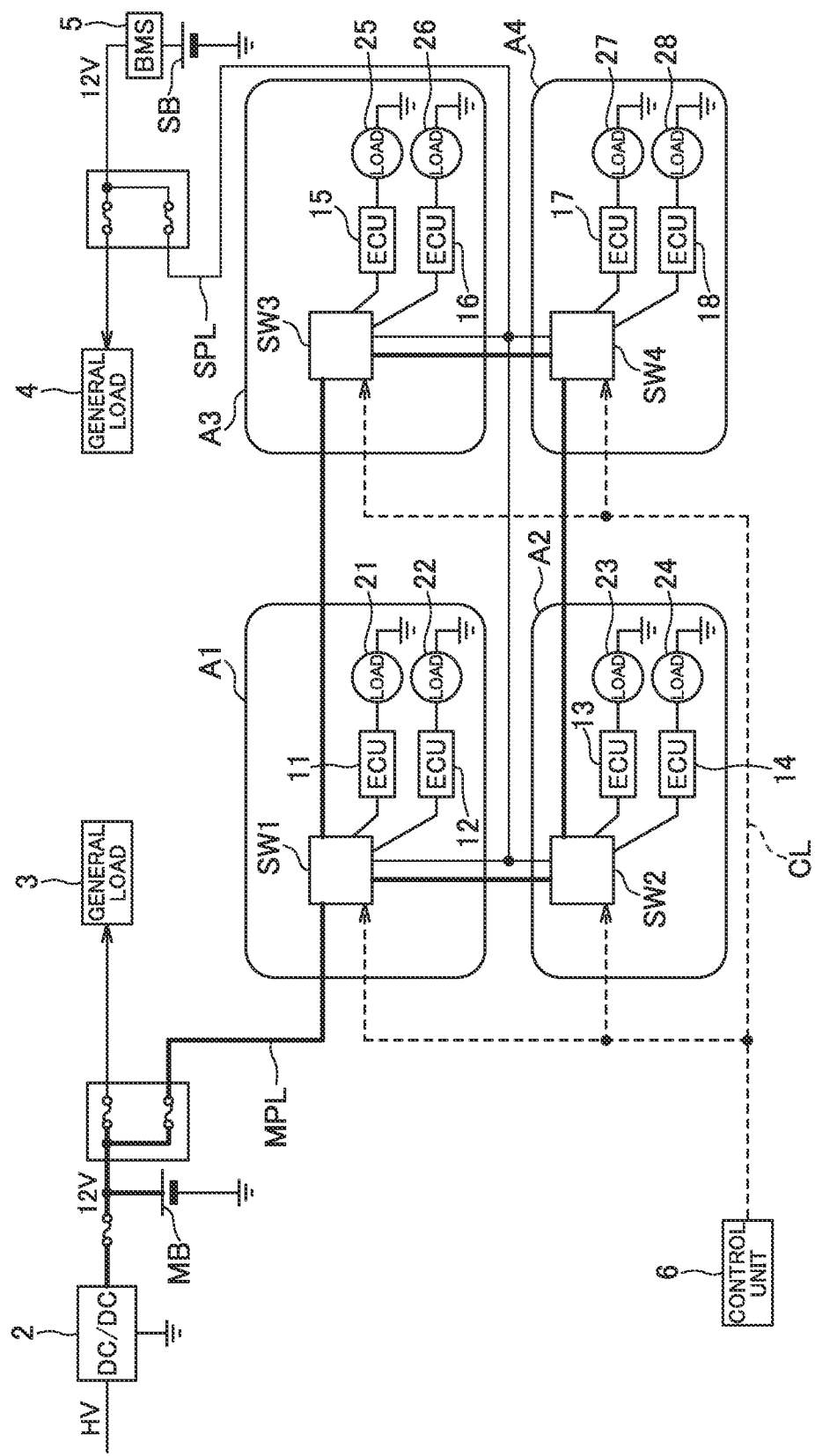
FIG. 11 shows another example for wiring arrangement of the power supply line MPL and the power supply line SPL.
Figure 12:
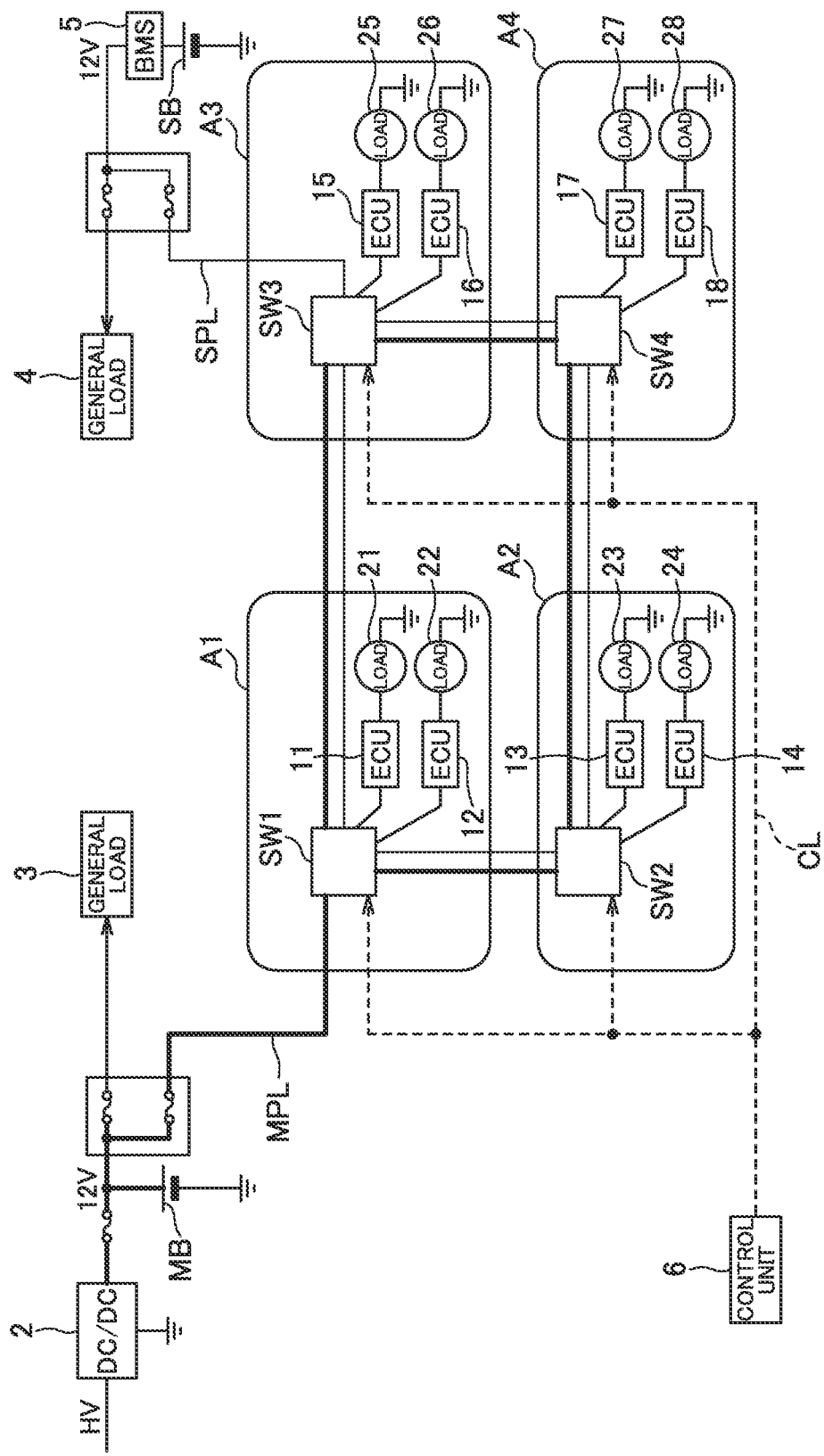
FIG. 12 shows another example for wiring arrangement of the power supply line MIT and the power supply line SPL.

FIGS. 10 to 12 show other examples for wiring arrangement of the power supply line MPL and the power supply line SPL. FIG. 10 shows a ring-shaped wiring arrangement of the power supply line MPL for the switching boxes SW1 to SW4. The wiring of the power supply line SPL is arranged in the same manner as FIG. 1. FIG. 11 shows a ring-shaped wiring arrangement of the power supply line MPL as shown in FIG. 10, wherein for the power supply line SPL, the wiring is arranged to connect the switching boxes SW1 to SW4 directly to the sub-battery (also referred to as "bus-shaped"). FIG. 12 shows ring-shaped wiring arrangements of both of the power supply lines MPL and SPL for the switching boxes SW1 to SW4. As shown above, the wiring of the power supply line MPL and power supply line SPL may be arranged in various shapes, wherein different wiring configurations may be used for the power supply line MPL and the power supply line SPL.

As shown in FIGS. 1 and 10 to 12, the switching boxes SW1 to SW4 (switching sections) are connected directly to at least one of the main battery MB (first power supply section) and the sub-battery SB (second power supply section). Furthermore, the switching boxes SW1 to SW4 (switching sections) are connected to at least one of the main battery MB (first power supply section) and the sub-battery SB (second power supply section) via another switching box(es) (switching section).

This means that the wiring from the main battery MB to the switching boxes SW1 to SW4 in the first to fourth areas A1 to A4 may extend along a different path from that of the wiring from the sub-battery SB to the switching boxes SW1 to SW4 in the first to fourth areas A1 to A4, so that it is possible to avoid simultaneous power supply failures for the main battery MB and the sub-battery SB.

Figure 13:
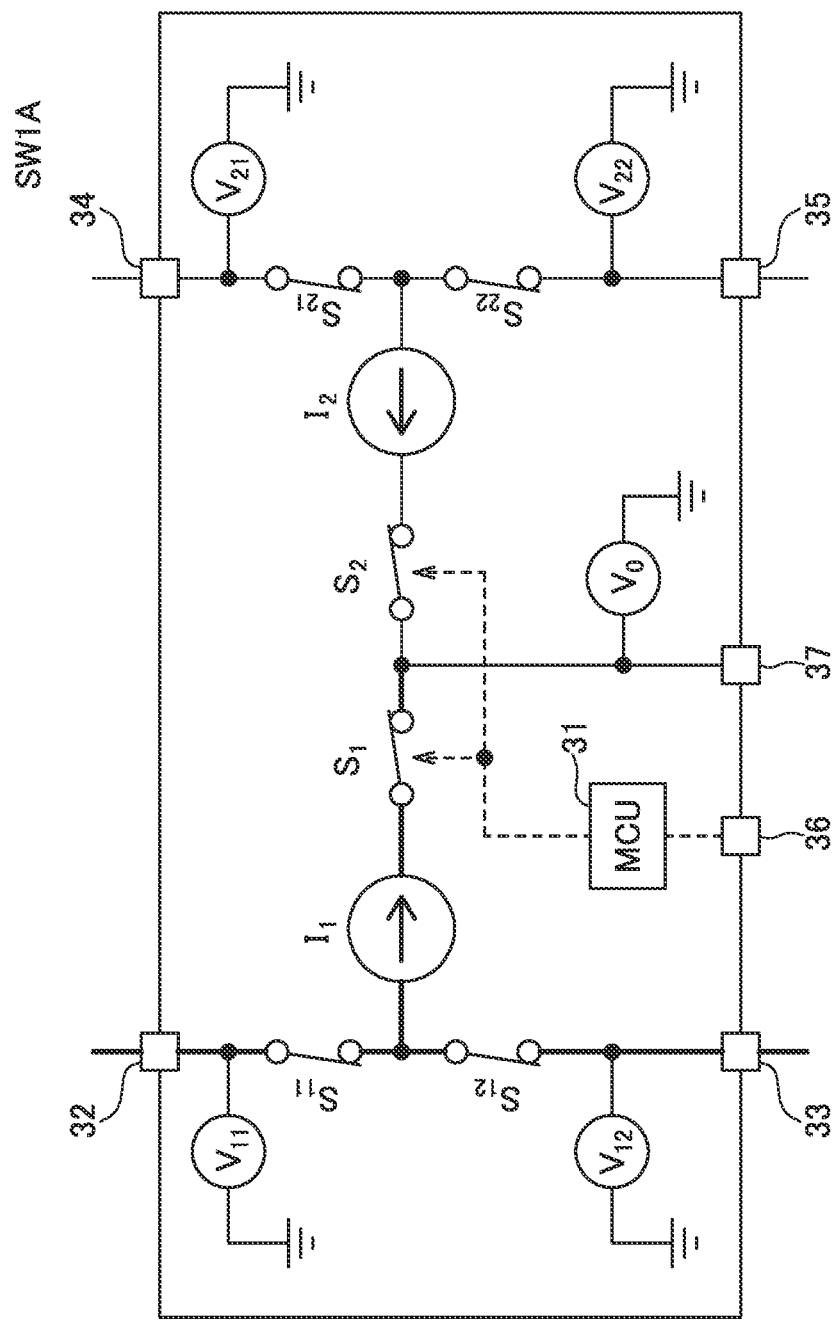
FIG. 13 shows a structure diagram of an exemplar variation of the switching box.

FIG. 13 shows an exemplar variation of the switching box. In the structure as shown in FIG. 2, redundancy of power supply is not possible when power supply failures simultaneously occur at two points on the wiring paths of the power supply line MPL and the power supply line SPL between the switching boxes (see FIG. 14).

A switching box SW1A according to FIG. 13 is configured by removing the voltage meters V1 and V2 from the structure of FIG. 2 and by adding switches S11, S12, S21, S22 as well as voltage meters V11, V12, V21, V22 to the structure of FIG. 2.

The switch S11 is arranged between the main-side connection terminal 32 and the current meter I1. The switch S12 is arranged between the main-side connection terminal 33 and the current meter I1. The switch S11 and switch S12 are connected in series. The switch S21 is arranged between the sub-side connection terminal 34 and the current meter I2. The switch S22 is arranged between the sub-side connection terminal 35 and the current meter I2. The switch S21 and switch S22 are connected in series.

This means that the switch S11 functions as a third switch (or fourth switch) arranged on a side of the main battery MB (first power supply section) with respect to the first switch, wherein the switch S12 functions as a fourth switch (or third switch) arranged on the side of the main battery MB (first power supply section) with respect to the first switch. The switch S21 functions as a fifth switch (or sixth switch) arranged on a side of the sub-battery SB (second power supply section) with respect to the second switch, wherein the switch S22 functions as a sixth switch (or fifth switch) arranged on a side of the sub-battery SB (second power supply section) with respect to the second switch.

The voltage meter V11 measures (detects) a voltage applied to the switch S11. The voltage meter V12 measures (detects) a voltage applied to the switch S12. The voltage meter V21 measures (detects) a voltage applied to the switch S21. The voltage meter V22 measures (detects) a voltage applied to the switch S22.

The switching box SW1A is configured such that an upstream side (e.g. the main-side connection terminal 32 side and/or the sub-side connection terminal 34 side) and a downstream side (e.g. the main-side connection terminal 33 side and/or the sub-side connection terminal 35 side) can be completely disconnected from each other via the switches S11, S12, S21 and S22.

Figure 14:
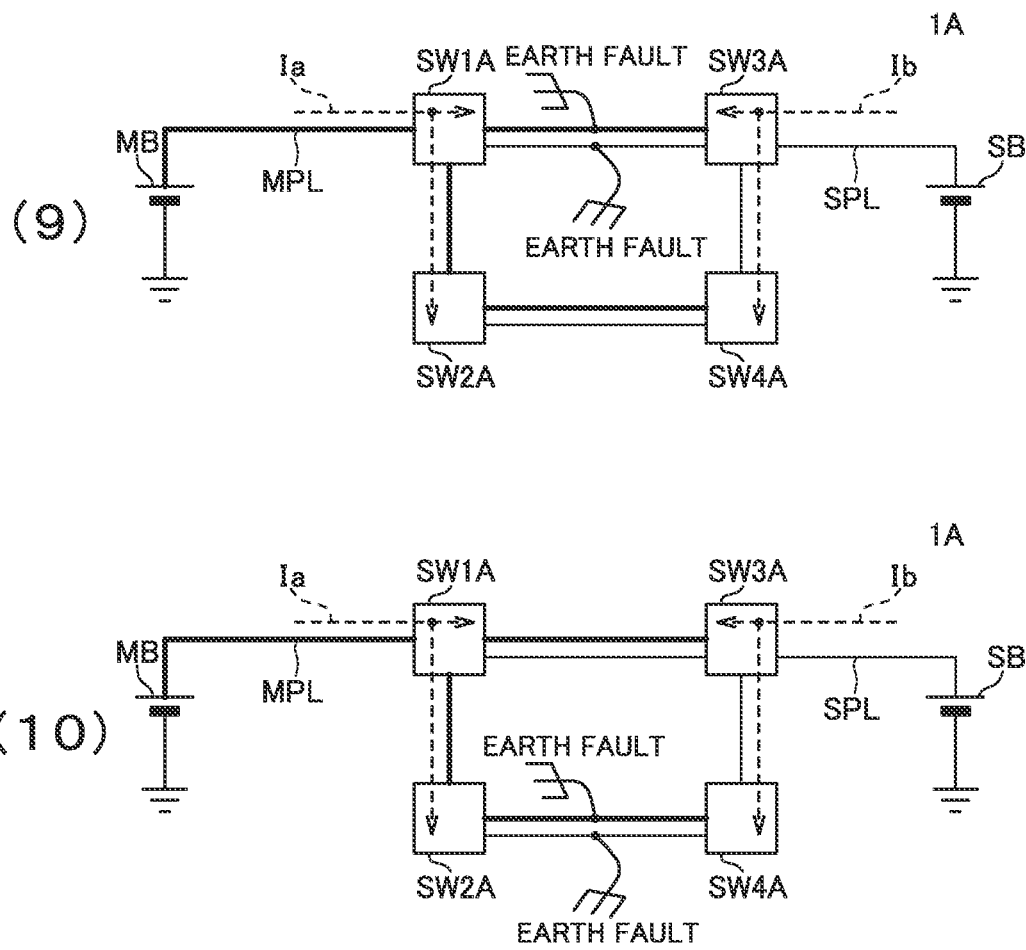
FIG. 14 shows a schematic view of a power supply system with the switching box according to FIG. 13.

FIG. 14 shows a schematic view of a power supply system 1A with the switching box SW1A according to FIG. 13. In FIG. 14, the switching boxes SW2A to SW4A are configured in the same manner as the switching box SW1A. In this Figure, (9) shows a case where earth faults exist on both of the power supply line MPL and the power supply line SPL between the switching box SW1A and the switching box SW3A. (10) shows a case where earth faults exist on both of the power supply line MPL and the power supply line SPL between the switching box SW2A and the switching box SW4A. Here, the numbers in brackets in FIG. 14 are serial numbers following the numbers as used in FIG. 5. This means that the two views show the ninth and tenth patterns of power supply failure.

FIG. 14 shows cases where power supply failures simultaneously occur at two points on the power supply line MPL and the power supply line SPL. In these cases, the switching boxes SW1A and SW2A are disconnected (isolated) from the switching boxes SW3A and SW4A by switching the switches S11, S12, S21, S22 in the switching boxes SW1A to SW4A in order to ensure redundant paths.

Once the redundant paths are ensured in this manner, a current Ia flows from the main battery MB to the switching boxes SW1A and SW4A so that power supply is accomplished to the associated first area A1 and second area A2. Further, a current Ib flows from the sub-battery SB to the switching boxes SW3A and SW4A so that power supply is accomplished to the associated third area A3 and fourth area A4.

In the case where the switching boxes SW1A to SW4A are applied to the ring-shaped wiring arrangements of the power supply lines as shown in FIGS. 10 to 12, it is possible to change the wiring paths so that in the ring for the main battery (power supply line MPL), a power supply failure (earth fault) point(s) can be disconnected (isolated) via the switches S11 and S12, wherein in the ring for the sub-battery (power supply line SPL), a power supply failure (earth fault) point(s) can be disconnected (isolated) via the switches S21 and S22, which enable power supply redundancy with higher reliability.

According to the present embodiment, the power supply system 1 includes the main battery MB configured to provide power, and the sub-battery SB which is separate from the main battery MB and configured to provide power. The power supply system 1 further includes the switching boxes SW1A to SW4A arranged in the first to fourth areas A1 to A4 which are a plurality of power supply areas, the plurality of power supply areas being configured to be supplied with power from the main battery MB and the sub-battery SB, wherein the switching boxes SW1A to SW4A are configured to switch an on/off state of power supply into the first to fourth areas A1 to A4 from the main battery MB and to switch an on/off state of power supply into the first to fourth areas A1 to A4 from the sub-battery SB. Furthermore, the power supply system 1 includes the control unit 6 configured to perform switching control of the on/off state for the switching boxes SW1A to SW4A.

The above configuration of the power supply system 1 enables the power supply from the main battery MB and the sub-battery SB to be switched on/off with the switching boxes SW1A to SW4A, whereby it is not necessary to provide e.g. a battery for each area and it is enabled with low costs to stabilize power supply voltages of multiple areas and/or to achieve redundancy. Even when an additional area is provided, it is only necessary to add a switching box.

Further, each of the switching boxes SW1A to SW4A includes the switch S1 and switch S2, wherein the switch S1 is configured to switch the on/off state of the power supply from the main battery MB and the switch S2 is configured to switch the on/off state of the power supply from the sub-battery SB. In this manner, it is possible to switch the on/off state of the power supply for the main battery MB and the sub-battery SB individually. Therefore, it is possible to achieve an appropriate power supply depending on existence of an earth fault on each of the power supply line MPL for the main battery MB and the power supply line SPL for the sub-battery SB, and/or an operation state of e.g. an equipment in which the power supply system 1 is installed, such as a vehicle.

Furthermore, the switch S1 and the switch S2 are configured such that power supply to the load is initiated by switching on one of the switch S1 and switch S2, wherein the load is provided in the power supply area. In this manner, it is possible to perform power supply from one of the main battery MB and the sub-battery SB, which may enable redundancy of the power supply paths.

Furthermore, the switch S1 and the switch S2 are configured such that the power supply path from the main battery MB and the power supply path from the sub-battery SB are electrically connected by switching on both of the switches S1 and S2. This enables the sub-battery SB to be charged from the main battery MB and/or the DC/DC converter 2.

Moreover, each of the switching boxes SW1A to SW4A includes the switch S11 and the switch S12 on the side of the main battery MB with respect to the switch S1, as well as the switch S21 and the switch S22 on the side of the sub-battery SB with respect to the switch S2. In this manner, even when power supply failures occur on the power supply line MPL and the power supply line SPL between the same switching boxes, it is possible to ensure a redundant path while isolating the power supply failure points.

Further, the power supply system 1 includes the current meter I1 and current meter I2 configured to detect the current value i1 of current flowing from the main battery MB and the current value i2 of current flowing from the sub-battery SB in the switching boxes SW1A to SW4A, respectively, and the voltage meter V1 and voltage meter V2 configured to detect the voltage value v1 of voltage on the side of the main battery MB and the voltage value v2 of voltage on the side of the sub-battery SB in the switching boxes SW1A to SW4A, respectively. In addition, the control unit 6 is configured to control the switching boxes SW1A to SW4A based on the current value i1 and voltage value v1 as well as based on the current value i2 and the voltage value v2. In this manner, it is possible to detect (determine) existence of power supply failure on the side of the main battery MB based on overcurrent and/or voltage drop on the side of the main battery MB, and it is further possible to detect (determine) existence of power supply failure on the side of the sub-battery SB based on overcurrent and/or voltage drop on the side of the sub-battery SB.

Furthermore, the control unit 6 is configured to detect a power supply failure based on the current value i1 and the voltage value v1 on the side of the main battery MB as well as based on the current value i2 and the voltage value v2 on the side of the main battery MB, wherein the control unit 6 switches the switch S1 so as to switch off the power supply from the side of the main battery MB if a power supply failure occurs on the side of the main battery MB, and wherein the control unit 6 switches the switch S2 so as to switch off the power supply from the side of the sub-battery SB if a power supply failure occurs on the side of the sub-battery SB. In this manner, it is possible to detect existence of power supply failure on the side of the main battery MB and existence of power supply failure on the side of the sub-battery SB individually. In addition, the power supply from the main battery MB can be stopped in the case of power supply failure on the side of the main battery MB, and the power supply from the sub-battery SB can be also stopped in the case of power supply failure on the side of the sub-battery SB.

Moreover, the wiring from the main battery MB to the switching boxes SW1A to SW4A in the first to fourth areas A1 to A4 extends along a different path from that of the wiring from the sub-battery SB to the switching boxes SW1A to SW4A in the first to fourth areas A1 to A4, so that it is possible to avoid simultaneous power supply failures for the main battery MB and the sub-battery SB.

The present invention is not limited to the above-described embodiments. Namely, those skilled in the art may modify and implement the embodiments based on the knowledge in the prior art without departing from the core of the present invention. It should be understood that such modifications fall under the scope of the invention as long as they include the features of the power supply system according to the present invention.

REFERENCE SIGNS LIST

1 Power supply system
6 Control unit (control section)
MB Main battery (first power supply section)
SB Sub-battery (second power supply section)
A1-A4 First to fourth areas (power supply areas)
SW1-SW4 Switching boxes (switching sections)
I1, I2 Current meters (current detecting sections)
V1, V2 Voltage meters (voltage detecting sections)
S1 Switch (first switch)
S2 Switch (second switch)
S11 Switch (third switch)
S12 Switch (fourth switch)
S21 Switch (fifth switch)
S22 Switch (sixth switch)

What is claimed is:

1. A power supply system comprising:
a first power supply section configured to supply power;
a second power supply section configured to supply power, wherein the second power supply section is separate from the first power supply section;
switching sections each of which is provided in each of a plurality of power supply areas, the plurality of power supply areas being configured to be supplied with power from the first power supply section and the second power supply section, wherein each of the switching sections is configured to switch an on/off state of power supply from the first power supply section into a corresponding power supply area of the plurality of power supply areas and to switch an on/off state of power supply from the second power supply section into the corresponding power supply area; and
a control section configured to perform switching control of the on/off state for the switching sections,
wherein each of the switching sections includes a first switch and a second switch, wherein the first switch is configured to switch the on/off state of the power supply from the first power supply section and the second switch is configured to switch the on/off state of the second power supply section,
wherein the first switch and the second switch are configured such that a power supply path of the first power supply section and a power supply path of the second power supply section are electrically connected to each other by switching on both of the first switch and the second switch, and wherein each of the switching sections includes:
a third switch and a fourth switch on a side of the first power supply section with respect to the first switch; and
a fifth switch and a sixth switch on a side of the second power supply section with respect to the second switch.

2. The power supply system according to claim 1,
wherein the first switch and the second switch are configured such that power supply to a load is initiated by switching on one of the first switch and the second switch, wherein the load is provided in the power supply area.

3. The power supply system according to claim 1, further comprising:
a first current detecting section configured to detect a first current value which is a value of a current flowing from a side of the first power supply section in the switching sections; and
a second current detecting section configured to detect a second current value which is a value of a current flowing from a side of the second power supply section in the switching sections,
wherein the control section is configured to control the switching sections based on the first current value and the second current value.

4. The power supply system according to claim 3,
wherein the control section is configured to:
detect a power supply failure based on the first current value and the second current value;
switch off the power supply from the first power supply section if the power supply failure occurs on the side of the first power supply section; and
switch off the power supply from the second power supply section if the power supply failure occurs on the side of the second power supply section.

5. The power supply system according to claim 1, further comprising:
a first voltage detecting section configured to detect a first voltage value which is a value of a voltage on a side of the first power supply section in the switching sections; and
a second voltage detecting section configured to detect a second voltage value which is a value of a voltage on a side of the second power supply section in the switching sections,
wherein the control section is configured to control the switching sections based on the first voltage value and the second voltage value.

6. The power supply system according to claim 5,
wherein the control section is configured to:
detect a power supply failure based on the first voltage value and the second voltage value;
switch off the power supply from the first power supply section if the power supply failure occurs on the side of the first power supply section; and
switch off the power supply from the second power supply section if the power supply failure occurs on the side of the second power supply section.

7. The power supply system according to claim 1, wherein wiring extending from the first power supply section to more than one of the switching sections forms paths which are different from paths formed by wiring extending from the second power supply section to more than one of the switching sections.

\* \* \* \* \*